United States Patent
Rollins

(10) Patent No.: US 7,223,957 B2
(45) Date of Patent: May 29, 2007

(54) SENSOR INCLUDING CIRCUITRY FOR RECOVERING TIME-VARYING INFORMATION AND REMOVING DC OFFSETS

(75) Inventor: George E. Rollins, Chelmsford, MA (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 67 days.

(21) Appl. No.: 11/107,443

(22) Filed: Apr. 15, 2005

(65) Prior Publication Data

US 2006/0231741 A1 Oct. 19, 2006

(51) Int. Cl.
*G01J 1/44* (2006.01)
*H03F 3/08* (2006.01)

(52) U.S. Cl. ............ 250/214 R; 250/214 A; 250/214 C

(58) Field of Classification Search .......... 250/214 R, 250/214 A, 214 C; 330/277, 250; 257/288, 257/290, 291; 327/101; 398/208
See application file for complete search history.

(56) References Cited

U.S. PATENT DOCUMENTS

| | | | | |
|---|---|---|---|---|
| 3,906,389 A | * | 9/1975 | Matsumoto et al. | 330/59 |
| 4,409,500 A | | 10/1983 | Welland | |
| 5,241,388 A | * | 8/1993 | Schofield et al. | 348/607 |
| 5,387,979 A | * | 2/1995 | Brauer et al. | 356/435 |
| 5,854,683 A | * | 12/1998 | Keane | 356/430 |
| 6,894,568 B2 | * | 5/2005 | Seetharaman et al. | 330/308 |
| 2002/0043971 A1 | | 4/2002 | Noda | |
| 2002/0113651 A1 | * | 8/2002 | Burt | 330/258 |
| 2003/0058035 A1 | * | 3/2003 | Taubman | 327/560 |
| 2003/0201381 A1 | * | 10/2003 | Baumgartner | 250/214 A |
| 2005/0077925 A1 | * | 4/2005 | Bernardson | 327/98 |

OTHER PUBLICATIONS

Electronics Letters, vol. 25, No. 3, Feb. 2, 1989, pp. 228-230.

* cited by examiner

*Primary Examiner*—Georgia Epps
*Assistant Examiner*—Pascal M. Bui-Pho
(74) *Attorney, Agent, or Firm*—John T. Pienkos; William R. Walbrun

(57) ABSTRACT

An amplification circuit for implementation in sensors such as photodetectors and other devices, and related method of amplification, are disclosed. In some embodiments, the amplification circuit includes a first amplifier that receives an input signal at least indirectly from a photosensitive device and provides an amplified signal based upon the input signal, where each the amplified signal at least includes a time-varying signal component, and a recovery circuit that receives the amplified signal and provides an output signal indicative of at least a portion of the time-varying signal component of the amplified signal. The recovery circuit includes a current splitting component that operates to generate negative and positive signals indicative respectively of negative and positive portions of the time-varying signal component, and the negative and positive signals are generated in a manner such that there are no substantial discontinuities between those signals at crossover points between those signals.

26 Claims, 5 Drawing Sheets

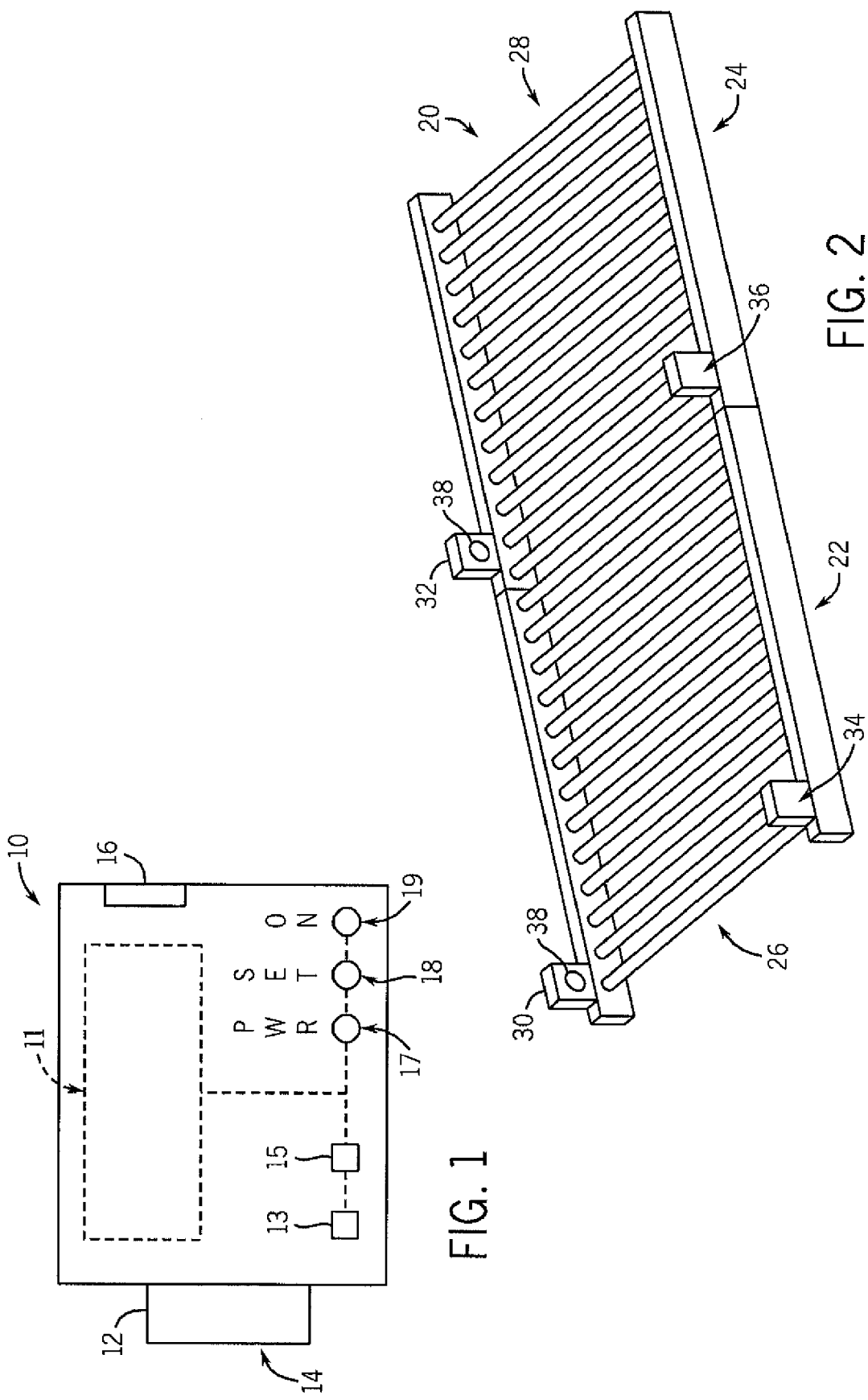

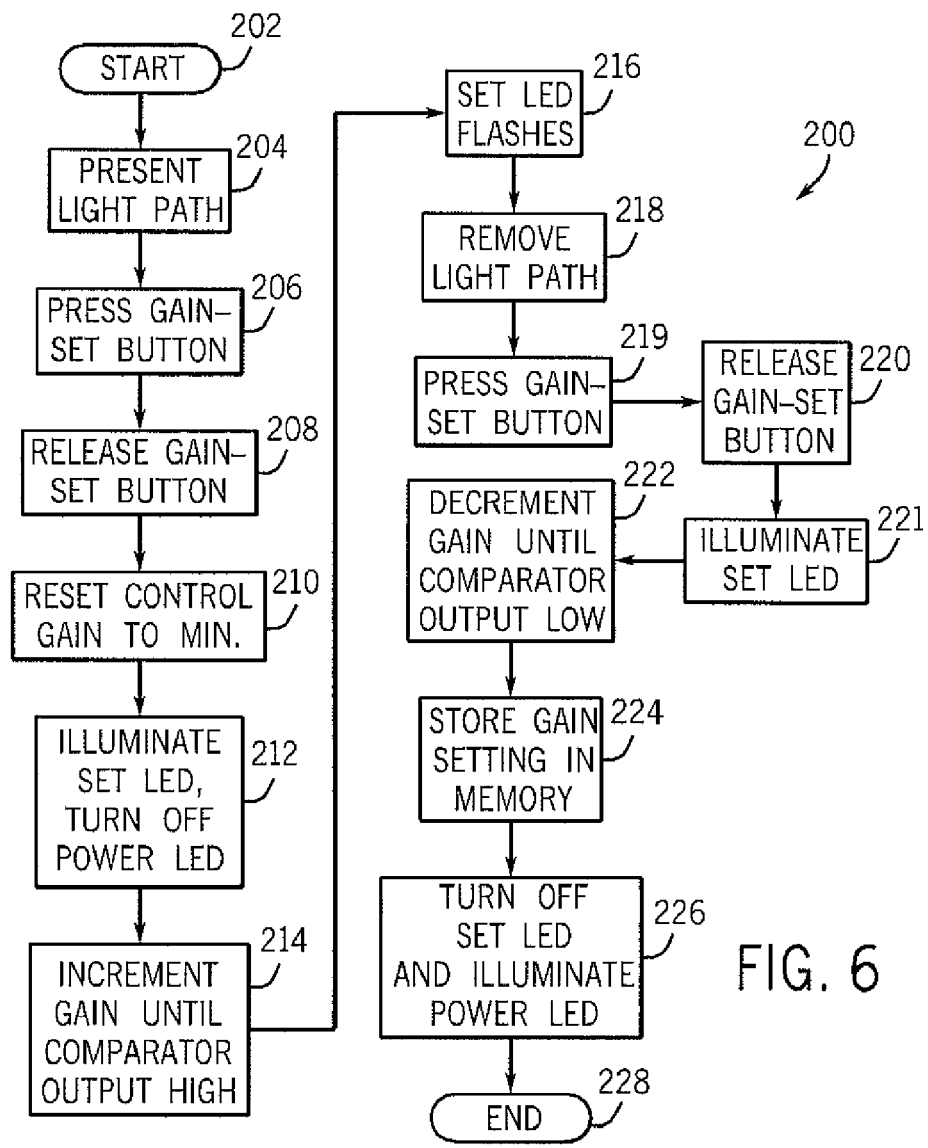
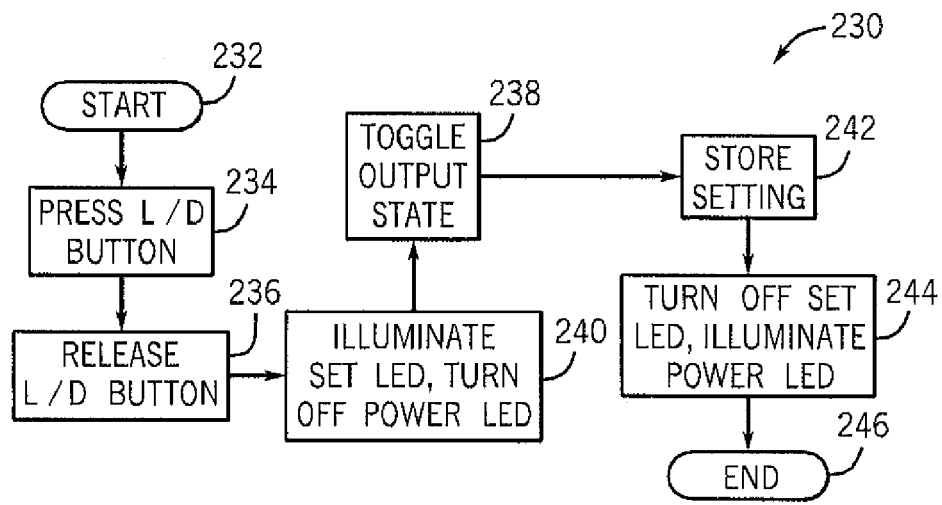

SENSOR INCLUDING CIRCUITRY FOR RECOVERING TIME-VARYING INFORMATION AND REMOVING DC OFFSETS

CROSS-REFERENCE TO RELATED APPLICATIONS

--

STATEMENT REGARDING FEDERALLY SPONSORED RESEARCH OR DEVELOPMENT

--

FIELD OF THE INVENTION

The present invention relates to sensors and, more particularly, relates to circuits that process and amplify incoming signals such as pulse signals received from sensing devices.

BACKGROUND OF THE INVENTION

A variety of types of sensors exist for application in a wide variety of situations. Among these sensors are, for example, photodetectors/photosensors, infrared sensors, laser sensors, microwave sensors, proximity sensors, ultrasonic sensors, inductive sensors, magnetic sensors, among others. Many of these sensors operate by sensing/receiving analog signal inputs. The sensors in turn typically process these analog signal inputs in various ways.

In particular with respect to photodetectors, for example, such devices are employed in a wide variety of applications for a wide variety of purposes. In some embodiments, a light signal is provided by a light emitting device at one position and a photodetector is employed at another position to detect whether that light signal has been interrupted or not, either because the light signal is being turned on and off or because something has cut or interrupted the light path between the light emitting device and the photosensitive device. Photodetectors implemented in this manner can be utilized in a variety of applications such as industrial conveyor systems, in which it typically is necessary to detect whether items being conveyed have passed into or left a given region along the conveyor system, or in industrial systems that are designed to determine whether particular conditions are or are not met (e.g., light curtains).

In many applications, information is conveyed from a light emitting device to a photodetector by rapidly switching or pulsing the light emitting device on and off so. Depending upon the circumstance, this pulsed signal can take the form of a square wave, the form of an AC (or effectively-AC) signal, or some other form. Based upon the frequency of the pulsing, the duration of the pulses, the magnitude of the pulses, the duty cycle, and a variety of other factors (e.g., possibly, the color of the light being transmitted), a variety of information can be transmitted to the photodetector. The coding of this information can involve, for example, amplitude-modulation, frequency-modulation, phase-modulation, polarity-modulation.

Due to the many uses of photodetector circuits, such circuits have become ubiquitous. To reduce the circuits' size and cost, the circuits have increasingly been implemented in the form of integrated circuits rather than out of discrete components. Despite such size and cost improvements, however, conventional photodetector circuits nevertheless suffer from certain inadequacies. First, to the extent that the pulsed or AC information received by the photodetector contains information that is of interest, it is necessary that the AC information be recoverable. Yet conventional recovery circuits, such as conventional rectification or peak detection circuits, typically utilize diodes or transistors that have significant forward-conductive voltage drops (e.g., 0.7 Volts) across them. Consequently, the resulting signals output by those recovery circuits include an undesirable offset. Further, to the extent that such recovery circuits provide an output signal that represents both the positive (e.g., positive with respect to a neutral level of the AC signal) and the negative (e.g., negative with respect to the neutral level) swings of the received signal, discontinuities are created at the cross-over points between the positive and negative portions of the output signal as a result of the forward-conductive voltage drops.

Additionally, regardless of the aforementioned issues relating to the forward-conductive voltage drops within recovery circuits, conventional photodetectors have additional inadequacies. In particular, it is common that the AC signals received by photodetectors include a DC offset. This offset, which can be magnified during propagation within the photodetector circuit, can significantly distort the resulting output signal. Although some conventional photodetector circuits employ DC offset removal circuitry to address this problem, conventional removal circuitry typically involves the use of bypassing or decoupling capacitors that are too large for practical implementation on integrated circuits. Consequently, conventional photodetector circuits having DC offset removal circuitry, when implemented on integrated circuits, typically require discrete capacitors coupled to the integrated circuits. The use of these discrete capacitors increases manufacturing costs and can impact robustness.

Further, to the extent that any DC offset may have been introduced into the signal received by the photodetector circuit itself rather than introduced as part of the input to the photodetector circuit, conventional DC offset removal circuitry fails to eliminate such DC offsets. Thus, even though conventional DC offset removal circuitry does ameliorate the DC offset problem (albeit through the use of discrete capacitors), such conventional circuitry cannot by its nature eliminate all DC offsets.

Still another disadvantage associated with conventional photodetector circuits generally is that it can be relatively difficult in practice for technicians to calibrate the circuits. Photodetector circuits commonly are implemented in situations where it is important that the circuits be capable of differentiating between high and low levels of light corresponding effectively to "on" or "off". During setup of the photodetector circuits, the circuits are exposed to levels of light intended to be representative of levels that are likely to be experienced in practice, and the gain or amplification of the circuits is then adjusted/calibrated so as to arrive at an output signal that is representative of the light exposure. The calibration process should result in an amplification level that provides a strong output signal but at the same time does not excessively exaggerate unwanted signal components, particularly noise.

A common conventional practice for conducting this calibration is for a technician to hold down a button for a specific period of time during the calibration process to, where the period of time determines the eventual amount of gain. For example, by holding down the button for an amount of time lower than a threshold, the amplification might be set to one level and, by holding down the button for an amount of time higher than the threshold, the amplification might be set to a second, different level. While this procedure has been used in practice, the procedure has proven to be somewhat unreliable, since the amount of gain is dependent upon the skill of the technician performing the adjustment, for example, upon the ability of the technician to hold down the button for an appropriate amount of time. As a result, it is sometimes if not often difficult to achieve consistency in the calibration of photodetectors, particularly insofar as calibrations can be performed differently by different technicians.

In view of the above, it would be advantageous if a new photodetector could be developed that addressed one or more of the inadequacies associated with conventional photodetectors. In particular, it would be advantageous if a new photodetector circuit could have an AC recovery circuit that successfully recovered AC information from an introduced signal without introducing significant distortions into that information due to diode-type voltage drops within the AC recovery circuit. It also would be advantageous if a new photodetector circuit could be designed that was capable of lessening or entirely eliminating DC offsets introduced to the photodetector circuit in the signals input thereto, where such DC offset removal circuitry could be more easily implemented on integrated circuits without the use of large, discrete capacitor components. It further would be advantageous if such DC offset removal circuitry not only served to reduce or eliminate DC offsets introduced by the signals input to the photodetector circuits, but also served to reduce or eliminate additional DC offsets introduced by internal operation of the photodetector circuits themselves. It additionally would be advantageous if the calibration process of photodetector circuits could be improved to reduce the difficulty with which technicians perform the process and improve the repeatability of the calibration process. It would likewise be advantageous if similar deficiencies to those discussed above with respect to photodetectors found in other types of sensors could similarly be ameliorated or eliminated.

BRIEF SUMMARY OF THE INVENTION

The present inventor has recognized the desirability of an improved amplifier circuit, for use in photodetectors and other devices as well, in which a time-varying portion of an input or amplified signal could be extracted without the introduction of substantial discontinuities into the resulting output signal due to the extraction process, and/or in which the resulting output signal did not have significant distortion due to DC offsets. The inventor has further recognized that, in at least some embodiments, an improved amplifier circuit that avoided the introduction of such discontinuities could be implemented by including a current splitter as the extraction circuit, where the current splitter was formed from the combination of an operational amplifier and a pair of matched, inverted MOSFETs. The inventor has additionally recognized that, in at least some of these or other embodiments, an improved amplifier circuit providing an output signal without significant DC offsets could be implemented, entirely on an integrated circuit, by incorporating an additional feedback circuit between the input and output of the main amplifier of the amplifier circuit.

In particular, the present invention relates to a sensor circuit that includes a first amplifier that receives an input signal at least indirectly from a sensing device and provides an amplified signal based upon the input signal, where the amplified signal at least includes a time-varying signal component, and a recovery circuit that receives the amplified signal and provides an output signal indicative of at least a portion of the time-varying signal component of the amplified signal. The recovery circuit includes a current splitting component that operates to generate negative and positive signals indicative respectively of negative and positive portions of the time-varying signal component, and the negative and positive signals are generated in a manner such that there are no substantial discontinuities between those signals at crossover points between those signals.

Further, the present invention relates to an amplification circuit that includes a first amplifier that receives an input signal at least indirectly from another device and provides an amplified signal based upon the input signal, where each the amplified signal at least includes a time-varying signal component. The amplification circuit additionally includes at least one of means for recovering at least a portion of the time-varying signal component, and means for removing a DC offset that is at least one of provided with the input signal and introduced by the means for recovering.

Additionally, the present invention relates to a method of amplifying a time-varying signal. The method includes receiving the time-varying signal at an input port of a first amplifier, and outputting an amplified time-varying signal an output port of the first amplifier. Further, the method includes at least one of extracting at least a portion of time-varying information within the amplified time-varying signal by way of a current-splitting circuit having a second amplifier and two complementary transistor devices, where an input terminal of the second amplifier is provided at least indirectly with the amplified time-varying signal and a signal indicative of an extracted portion of the time-varying information is output by at least one of the transistor devices, and removing a DC offset by way of a DC offset removal circuit having a third amplifier and a capacitor coupled between input and output terminals of the third amplifier, where the output terminal of the third amplifier is coupled at least indirectly to the input port of the first amplifier.

BRIEF DESCRIPTION OF THE DRAWINGS

FIG. 1 shows an exemplary photodetector;

FIG. 2 shows two exemplary sections of a modular conveyor system that each employ the exemplary photodetector of FIG. 1 in one exemplary application of that photodetector;

FIG. 6 shows steps of an exemplary calibration process capable of being implemented on certain embodiments of the photodetector circuits of FIGS. 1–3 and 5; and FIG. 7 shows steps of an additional exemplary procedure capable of being implemented on certain embodiments of the photodetector circuits of FIGS. 1–3 and 5.

DETAILED DESCRIPTION OF THE PREFERRED EMBODIMENT

Figure 3:
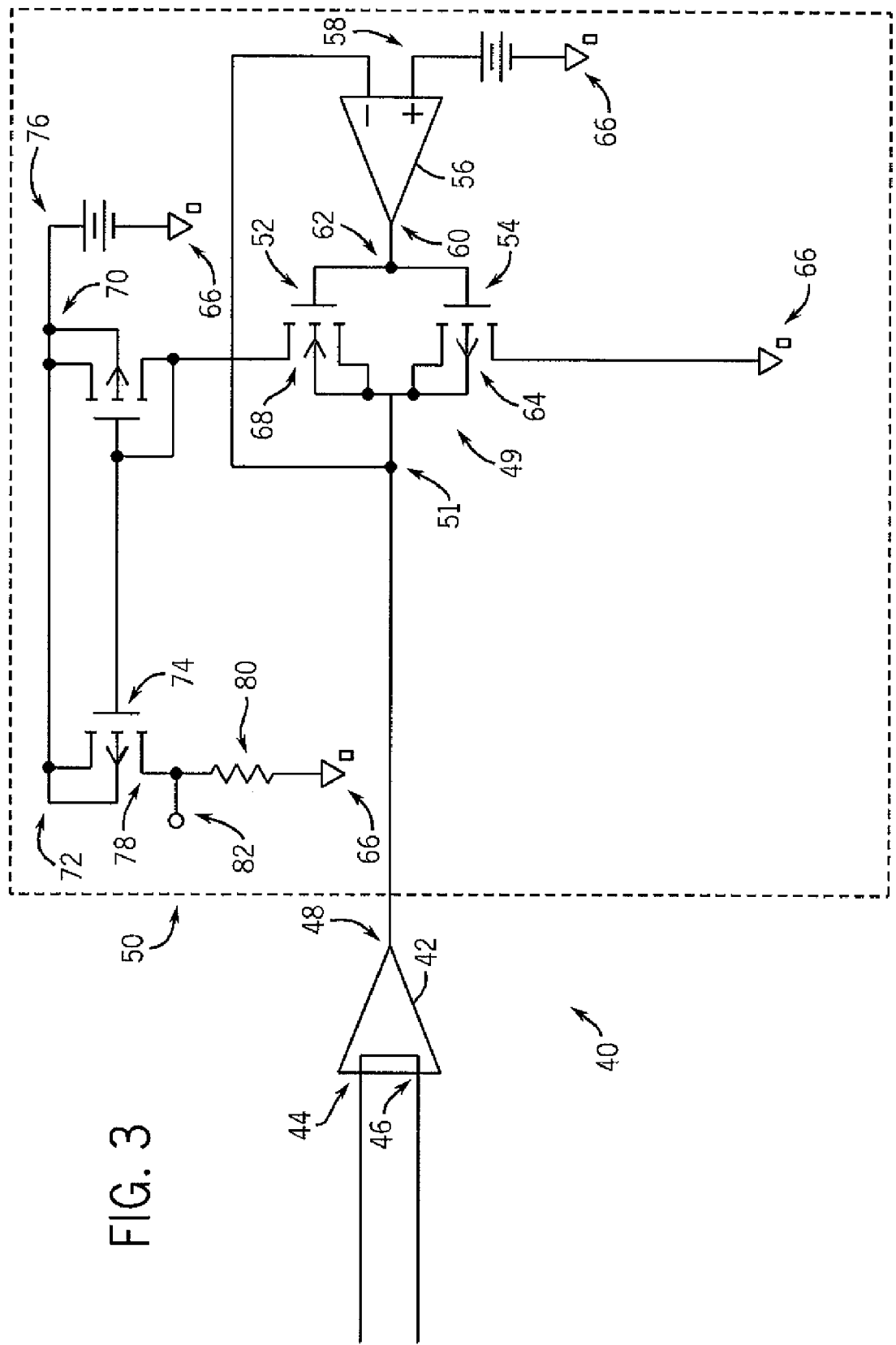
FIG. 3 shows an exemplary photodetector circuit that is capable of recovering AC information from a received input signal, and that can be implemented in the photodetector of FIG. 1.

Referring to FIG. 1, an exemplary photodetector 10 is shown in schematic form. The photodetector 10 has a housing 12 that supports at least one photosensitive device 14 such as a photosensitive semiconductor device. Also inside the housing 12 is circuitry 11 as well as possibly a power supply (not shown). In preferred embodiments, the circuitry 11 is primarily or exclusively implemented on one or more integrated circuits, for example, application specific integrated circuits (ASICs) or other microchips, albeit in other embodiments the circuitry could be formed from discrete components as well.

Depending upon the embodiment, the circuitry 11 can perform any of a variety of functions including, for example, control functions relating to the control and operation of the photosensitive device 12 and processing of the signals received therefrom. Also, as discussed in further detail below, the circuitry 11 is capable of certain signal processing functions such as amplification of signals received from the photosensitive device 12. The portion(s) of the circuitry performing control functions can also control such signal processing functions in particular.

The photodetector 10 can supply one or more output signals at an output terminal 16 as well as, in some embodiments, receive input signals at one or more input terminals. For example, the photodetector 10 can as shown in FIG. 1 have one or more buttons such as a gain-set button 15 and light/dark (L/D) button 13, which are discussed in more detail below. In alternate embodiments, communication of the photodetector 10 with operators/technicians and/or outside machines and other entities can be achieved by way of wireless communications devices including, for example, RFID devices.

In the embodiment shown, the photodetector 10 also in particular includes three light emitting diode outputs that serve as indicator lights to operators/technicians who may be installing or operating the photodetector, namely, a "power" LED 17, a "set" LED 18, and an "on" LED 19. In alternate embodiments, none of the LEDs 17–19 need be present, or one or more of those LEDs or other LEDs, or other output indicator devices (e.g., devices capable of providing sounds such as "beeps" to an operator/technician), can be provided.

Turning to FIG. 2, the photodetector 10 of FIG. 1 can be implemented in a variety of situations and in relation to a variety of applications. One exemplary application of the photodetector 10 is in a conveyor system 20 such as those commonly employed in industrial/manufacturing environments. As shown, the conveyor system 20 includes multiple conveyor sections or modules, such as a first conveyor section 22 and a second conveyor section 24. Further as shown, the first and second conveyor sections 22 and 24 respectively include pluralities of rollers 26 and 28, respectively, as well as first and second light sources 30 and 32, respectively, and also first and second photodetectors 34 and 36, respectively (each of which could be the photodetector 10 of FIG. 1).

The light sources 30 and 32, each of which has its own photoemission or light emitting device 38 (e.g., a conventional light bulb or a laser), are capable of being turned on and off in a controlled manner. Indeed, depending upon the embodiment, the intensity of the light emitted by the light sources 30, 32 can be varied continuously and/or controlled in a time-varying manner. For example, the intensity of the light emitted by the light sources 30, 32 could be controlled to take the form of a square wave, a sine wave, a triangular wave, or a pulsed signal of high, medium, low, or variable duty cycle. Further, depending upon the presence or absence of one or more objects on the rollers 26, 28 between the respective pairs of light emitting devices 30, 32 and photo detectors 34, 36, the paths of light between the light emitting devices 38 and the photodetectors 34, 36 could be uninterrupted or interrupted, as the case may be.

The conveyor system 20 represented by the pair of conveyor sections 22, 24 of FIG. 2 is only intended to be exemplary of one application in which photodetectors such as the photo detector 10 could be implemented, and it should be understood that such photo detectors could also be employed in a wide variety of other industrial, residential, security, office, agricultural, construction, and other environments and applications. For example, the photodetector 10 could be employed in conjunction with a security system where interruption of light to the photodetector signifies the presence of an intruder, or in conjunction with a garage door opener of a residential home where interruption of light to the photodetector signifies the presence of an obstruction that might preclude proper closing of the garage door.

Referring to FIG. 3, a portion of the circuitry 11 of the photodetector 10 that is of particular interest is shown in simplified schematic form, as circuitry 40. As discussed further below, the circuitry 40 in particular serves the purpose of allowing the photodetector 10 to amplify time-varying signals received from the photosensitive device 14. It will be understood to those of ordinary skill in the art that additional components for additional purposes can be added to the circuitry 40 of FIG. 3; nevertheless, the circuitry shown in FIG. 3 is intended to show certain improvements to photodetector circuitry in accordance with at least some embodiments of the present invention.

As shown in FIG. 3, the circuitry 40 includes a first amplifier 42 that is capable of receiving input signals from the photosensitive device 14 (see FIG. 1). In the embodiment shown, the first amplifier 42 is an operational amplifier in a shunt configuration that receives current signals from the photosensitive device 14. In particular, a first terminal 44 of the first amplifier 42 receives current from the photosensitive device 14 and then that current is returned via a second, return terminal 46. An output signal 48 is provided from the first amplifier 42 based upon the current flow into and out of terminals 44 and 46, and this output signal 48 is provided then to a recovery circuit 50, which as discussed below is intended to recover or extract all or a portion of the time-varying (or "AC") component(s) of the output signal 48.

As shown, the recovery circuitry 50 includes first and second complementary (or "balanced" or "mirrored") metal-oxide-semiconductor field-effect-transistors (MOSFETs) 52 and 54, where the first MOSFET 52 is a P-channel MOSFET and the second MOSFET 54 is an N-channel MOSFET. As shown, the output signal 48 is provided to a junction 51 to which each of the sources of the first and second MOSFETS 52, 54 is coupled. Additionally, the junction 51 is coupled to an inverting input of a second amplifier 56 that also is an operational amplifier. As shown, the non-inverting input of the second amplifier 56 is coupled to a reference voltage 58 while an output 60 of the second amplifier is coupled to a junction 62, to which each of the gates of the first and second MOSFETs 52, 54 is coupled.

Further as shown, the current output from a drain 64 of the second MOSFET 54 is directed to a ground 66, while the current output from a drain 68 of the first MOSFET 52 is provided to a third MOSFET 70. The third MOSFET 70 is part of a current mirror circuit 72 formed by the combination of that third MOSFET along with a fourth MOSFET 74. As shown, each of the third and fourth MOSFETs 70, 74 is a N-channel MOSFET, and the sources of both MOSFETs are coupled to a supply voltage 76. Also, the gates of the third and fourth MOSFETs 70, 74, are coupled to one another, and also the drain of the third MOSFET is coupled to its gate. A drain 78 of the fourth MOSFET 74 is coupled to a resistor 80, which is coupled between the drain 78 and the ground 66. The voltage across the resistor 80, provided at an output terminal 82, constitutes the output of the circuitry 50. This voltage is determined by the current flowing through the resistor 80, which in turn due to the functioning of the current mirror circuit 72 is equal to that of the current flowing out of the drain 68 toward the third MOSFET 70.

The first and second MOSFETs 52 and 54 together with the second amplifier 56 operate as a current splitter circuit 49. As such, the current flowing with respect to the drain 68 of the first MOSFET 52 is related to or representative of the positive portion of the time-varying output signal 48, e.g., the portion of the time-varying output signal that is above a zero or neutral level of that output signal. Similarly, the current flowing with respect to the drain 64 of the second MOSFET 54 is related to or representative of the negative portion of the time-varying output signal 48, e.g., the portion of the time-varying output signal that is below a zero or neutral level of that output signal. The neutral level is not necessarily a zero-voltage (or current) level, but rather typically can be understood as the level at which the area formed between the positive portion of the time-varying output signal and that level would be equal, over time, to the area formed between the negative portion of the time-varying output signal and that level.

The recovery circuitry 50 shown in FIG. 3 is specifically configured to provide the output 82 that is representative of the positive portion (e.g., above the neutral level) of the time-varying output signal 48 received from the amplifier 42, but not the negative portion (e.g., below the neutral level). As such, the recovery circuitry 50 functions somewhat like a half-wave rectifier, with the information corresponding to the negative portion of the time-varying output signal 48 being shunted to ground via the drain 64. Half-wave rectification is often of interest by itself insofar as, in many applications, only the pulsing on of the light source sending light to the photo detector is of interest, and further because typically the pulsing on of that light source occupies a relatively small proportion of the overall time of operation (e.g., the light transmission is a low duty cycle signal).

Nevertheless, because the first and second MOSFETs 52, 54, are complementary, in alternate embodiments a current mirror circuit similar to the current mirror circuit 72 could be coupled to the drain 64 of the second MOSFET 54 so as to provide an additional output (not shown) representative of the current flowing with respect to the drain 64, which in turn would be representative of the negative portion of the time-varying output signal 48. (Such an additional current mirror circuit is largely shown in FIG. 5, albeit in that example the second mirror circuit is not being employed for the purpose of providing an additional output.) Thus, while the AC recovery circuitry 50 and the embodiment of FIG. 3 operates similarly to a half-wave rectifier insofar as only the positive portion of the time-varying output signal 48 received from the amplifier 42 is reflected in the output of the circuitry 50, the circuitry could readily be modified to operate as a full-wave rectifier.

The recovery circuit 50 shown in FIG. 3 is advantageous in comparison with conventional recovery circuitry because it recovers the time-varying information provided from the amplifier 42 in a manner that is less distorted than is the case when conventional recovery circuitry is utilized. In particular, through the use of the first and second MOSFETs 52 and 54, and the second amplifier 56, the output current provided by the drain 68 (as well as at the drain 64) is not distorted due to the introduction of one or more diode-type forward biased voltage drops (e.g., 0.7 volt). Consequently, the output voltage at output terminal 82 is more closely reflective of the positive portion of the time-varying output signal 48 than would be the case if conventional recovery circuitry were employed.

Although FIG. 3 shows the use of MOSFETs 52 and 54, other transistor-type devices could also be employed. For example, in one alternate embodiment the first, P-channel MOSFET 52 could be replaced with a PNP bipolar junction transistor (BJT), while the second, N-channel MOSFET 54 could be replaced with a NPN BJT. In such an embodiment, the bases of the BJTs would be coupled to the junction 62, while the emitters of the BJTs would be coupled to the junction 51 and the collectors of the BJTs would provide the output currents similar to the drains 68, 64. In such embodiment, BJTs could also be employed in the current mirror circuit 72 as well. Further, in additional embodiments, a variety of different combinations of MOSFETs, BJTs, and other transistor or switching devices could be employed.

Figure 4:
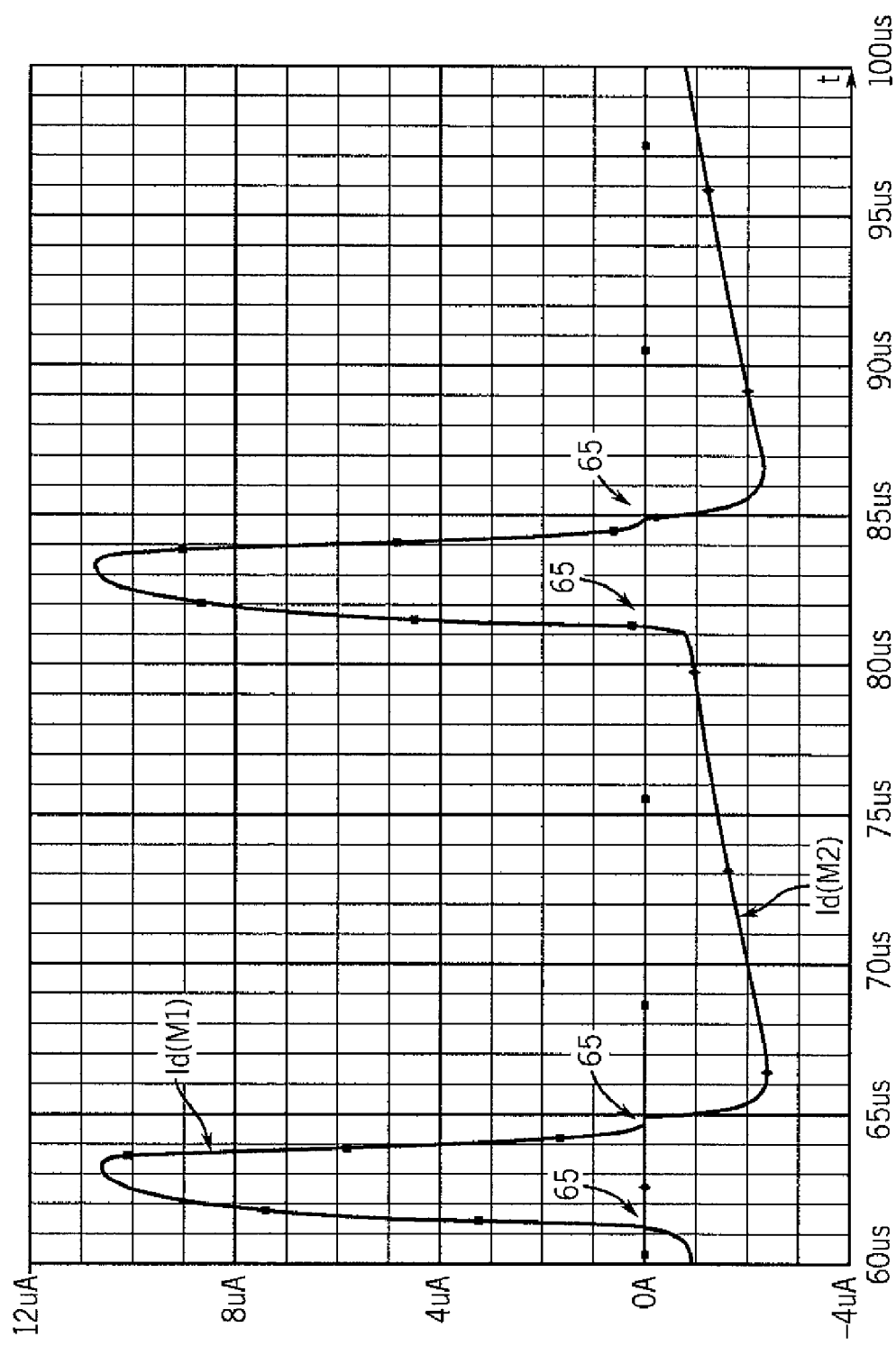
FIG. 4 shows an exemplary waveform showing that positive and negative portions of the recovered AC information in the photodetector circuit of FIG. 3 have aligned cross-over points so as to avoid significant discontinuities in the overall output signal.

FIG. 4 shows in a graphical manner the advantageous, relatively undistorted output signals that are provided by the recovery circuitry 50 in accordance with the present design. In particular, FIG. 4 shows both the positive and negative recovered information provided by the current splitter circuit 49. As shown, the recovered positive time-varying information associated with the drain current at the drain 68 of the first MOSFET 52 ($I_d(M1)$) meets up almost continuously with the negative recovered time-varying information associated with the drain current at the drain 64 of the second MOSFET 54 ($I_d(M2)$), without any significant discontinuities between the two portions of the information at crossover points 65. Thus, were the recovery circuitry 50 modified as discussed above to include not only the output terminal 82 representative of the positive time-varying information but also an additional output terminal representative of the negative time-varying information, those two types of information would be fully consistent with one another.

Figure 5:
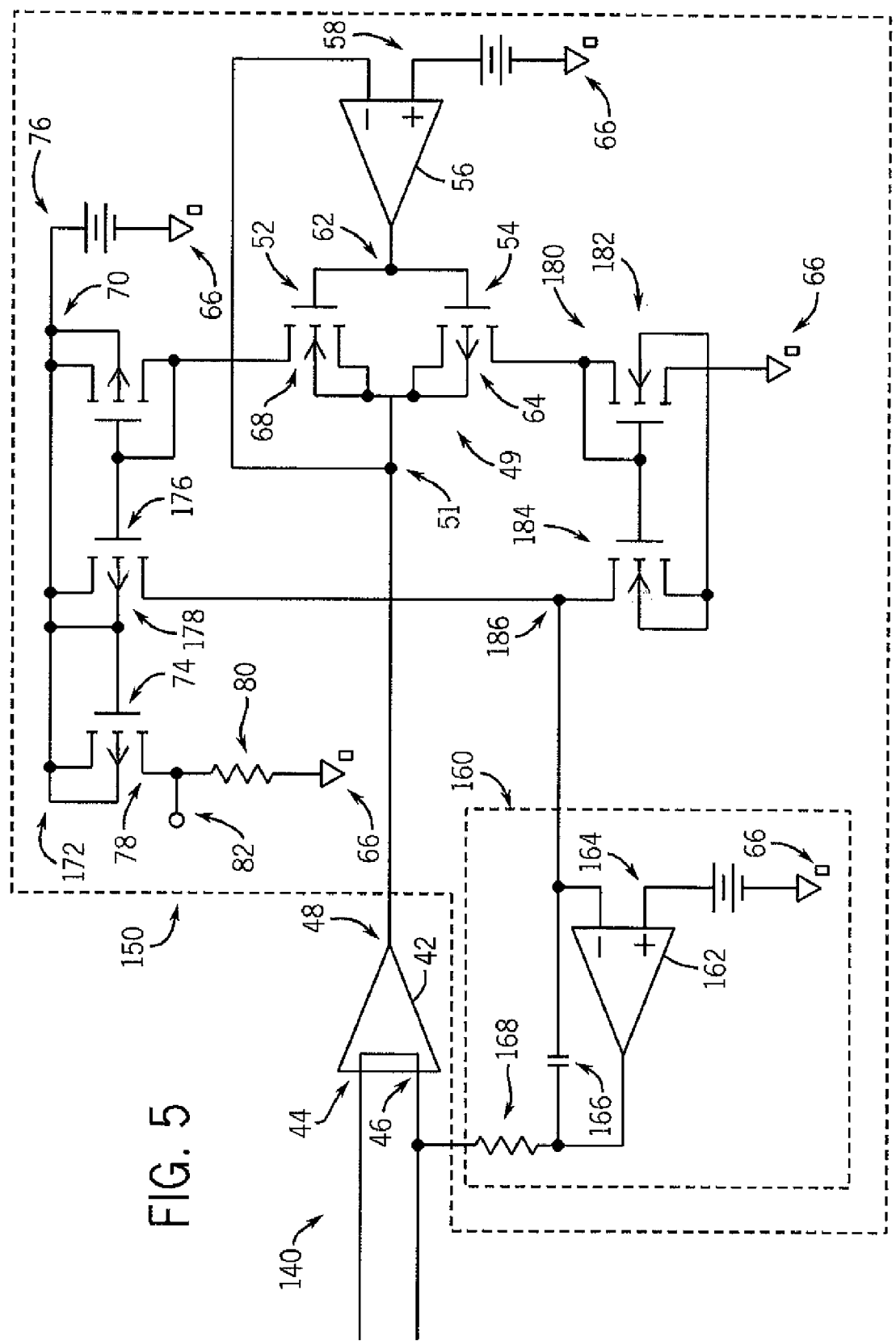
FIG. 5 shows an additional exemplary photodetector circuit similar to that of FIG. 3 except insofar as the photodetector circuit of FIG. 4 also includes DC offset removal circuitry.

Referring to FIG. 5, another embodiment of a portion of the circuitry 11 of the photodetector 10 relating to amplification of received signals is shown as circuitry 140. Although both circuitry 40 and 140 include the first amplifier 42, the circuitry 140 in contrast to the circuitry 40 includes somewhat different recovery circuitry 150. As shown, the recovery circuitry 150 like the recovery circuitry 50 receives the time-varying output signal 48 of the amplifier 42 and processes that signal by way of the current splitter circuit 49. Also, similar to the recovery circuitry 50, the recovery circuitry 150 further includes a current mirror circuit (in this case labeled circuit 172), that encompasses both the third MOSFET 70 and the fourth MOSFET 74, the sources of which are coupled to the voltage supply 76. Again, a voltage is output at the output terminal 82 that is representative of the current flowing out of the drain 68 of the first MOSFET 52.

At the same time, the recovery circuitry 150 of FIG. 5 differs from the circuitry of FIG. 3 insofar as the recovery circuitry 150 includes DC offset removal circuitry 160 that is coupled to the input 46 of the amplifier 42. The DC offset removal circuitry 160 includes a third amplifier 162 (also an operational amplifier) having a noninverting input that is coupled to a voltage reference 164, and an inverting input that is coupled to a capacitor 166 that in turn is coupled to both the output of the third amplifier 162 and to a resistor 168. The resistor 168 is coupled between the input 46 of the first amplifier 42 and the output of the third amplifier 162, while the capacitor 166 is coupled between the inverting input of the amplifier 162 and its output.

In addition to being coupled to the input 46 of the first amplifier 42, the DC offset removal circuitry 160 is also coupled to the remainder of the recovery circuitry 150 as follows. As shown, the current mirror 172 includes not just the third and fourth MOSFETs 70 and 74, but also includes an additional fifth MOSFET 176 (all three MOSFETs being n-channel MOSFETs). The fifth MOSFET 176 is coupled with respect to the third MOSFET 70 and the supply voltage 76 in the same manner as the fourth MOSFET 74, but has a drain 178 that (instead of being coupled to a resistor and providing a voltage output), is coupled to an additional current mirror circuit 180.

As shown, the additional current mirror circuit 180 parallels the structure of the third and fifth MOSFETs 70, 176, insofar as it has sixth and seventh MOSFETs 182 and 184 (in this case, p-channel MOSFETs), the sources of which are coupled to the ground 66 and the gates of which are coupled to one another as well as to the drain 64 of the second MOSFET 54. Further as shown, the drain of the sixth MOSFET 184 is coupled specifically to the drain 178 of the fifth MOSFET, 176. The additional current mirror circuit 180 thus parallels, in relation to the second MOSFET 54, the current mirror circuit formed specifically by the third and fifth MOSFETs 70, 176 in relation to the first MOSFET 52.

The purpose of the fifth MOSFET 176 and the additional current mirror circuit 180 is to allow reassembly of the positive and negative portions of the time-varying information. A junction 186 in particular links the drains 178, 184 of the fifth and sixth MOSFETs 176, 184, to allow for the reassembly of the positive and negative portions of the recovered time-varying information that was previously split due to operation of the current splitter circuit 49. The junction 186 is coupled as an input to the DC offset removal circuitry 160, and in particular is coupled to the inverting input of the third amplifier 162 and is also coupled to the capacitor 166.

The DC offset removal circuit 160, in the configuration shown in FIG. 5, serves to remove two types of DC offsets that otherwise might be introduced into the output of the recovery circuit 150. First, the DC offset removal circuitry 160 removes DC offsets that are provided directly to the inputs 44, 46 of the first amplifier 42. For example, if the current provided to the input 44 of the amplifier 42 varied between 5 microamps and 15 microamps, and had an average value of 10 microamps, the DC offset removal circuitry 160 would tend to remove 10 microamps of current.

Second, the DC offset removal circuitry 160 serves to remove any additional DC offsets that are introduced due to the operation of the current splitter circuit 49, as well as the various current mirror circuits 172, 180. This is achieved because the input to the DC offset removal circuitry 160 is tied to the junction 186 between the current mirror circuits rather than directly to the output 48 of the first amplifier. However, in alternate embodiments, the input of the AC recovery circuit 160 could indeed be coupled directly to the output 48 of the amplifier 42, although this is less preferred. In such event, the additional current mirror circuit 180, as well as the fifth MOSFET 176, would no longer be necessary.

Turning to FIG. 6, steps of an exemplary procedure for calibrating the photodetector 10 of FIG. 1 are shown in an exemplary flow chart 200. As shown, after starting at a step 202, the photodetector 10 is presented with a light path by a technician or other person setting up the photodetector system in a step 204. For example, the light emitting device 38 of FIG. 2 corresponding to the photodetector might be turned on (this also presumes that there is no physical blockage in the light path between the light emitting device and the photodetector). Once the light path is presented at the step 204, the technician then presses the gain-set button 15 of the photodetector to indicate that a normal or maximum level of light is being shined on the photodetector, at a step 206. Subsequently, at a step 208, the technician releases the gain-set button 15.

The pressing and releasing of the gain-set button 15 at the steps 206 and 208 provides the photodetector 10 with an indication that the normal or maximum level of light is being shined upon it. Given this to be the case, the photodetector 10 next at a step 210 resets its control gain to a minimum level, and further at a step 212 causes the photodetector to change its indication status by illuminating the "set" LED 18 and turning off the "power" LED 17 (see FIG. 1). Then, at a step 214 the circuitry 11 within the photodetector circuit 10 automatically increments the gain of the amplifier circuitry (e.g., the gain of the first amplifier 42 discussed with reference to FIGS. 3 and 5) until a comparator output level is high. In the present embodiment, the gain preferably is set to a level of 5 times the input signal (e.g., the input signal at terminals 44,46), although this is not necessary in other embodiments.

After incrementing the gain to a high level at the step 214, the photodetector 10 at a step 216 causes the "set" LED 18 to flash in a noticeable manner, for example, at a rate of 6 hertz. When this is happening, the technician realizes that is appropriate to interrupt/end the shining of the light upon the photodetector 10 by breaking the light path or otherwise, at a step 218. Upon discontinuing the shining of the light upon the photodetector 10, the technician then at steps 219 and 220 respectively presses and releases the gain-set button 15 a second time, which results in illumination of the "set" LED 18 at a step 221. Because the light has been discontinued, the signal now received at the photodetector is indicative of a low light level or a dark light level and consequently, the output of the photodetector should be at a low level. Nevertheless, in certain circumstances, the output of the photodetector 10 will not be at a low level despite discontinuing the light upon the photodetector.

In particular, noise can be at a sufficiently high level such that the amplification provided by the circuitry 11 (especially given that the gain is at a relatively high factor of 5) results in a large output signal notwithstanding the absence of light being provided to the photodetector. To avoid a situation where the photodetector outputs a large signal despite the absence of light upon the photodetector, at a step 222 in this circumstance (e.g., in a circumstance where the output signal exceeds a given threshold) decrements the gain until the comparator output of the photodetector is sufficiently low. For example, at the step 222, the gain could be reduced by 20% of more. To the extent that the gain is not excessive, and does not need to be reduced, step 222 can be skipped. Finally, at a step 224, the resulting gain-setting is stored in a memory portion of the circuitry 11 (or possibly in another location as well) and subsequently at a step 226 the "set" LED is turned off while the "power" LED is turned on, thus signifying the end of the procedure at a step 228 such that the photodetector can now be used in practice.

The steps of the procedure shown by the flow chart 200 can be implemented and practiced on the photodetector 10 in a variety of manners and by way of a variety of techniques. In certain embodiments, the procedure is implemented by way of programming on an application specific integrated circuit. Such programming can be implemented through the use of state diagrams as well as other programming languages. The particular procedure of the flow chart 200 is particularly advantageous in comparison with conventional photodetector systems that require a technician or other operator to carefully hold down a gain selecting button for a specific period of time in order to arrive at a particular gain. In contrast to such systems, the present procedure allows for effectively automatic setting of the gain that is accomplished with only two pushes of a button by the operator.

Referring to FIG. 7, an additional flow chart 230 is provided showing an additional exemplary procedure that can be performed by the photodetector 10. This procedure can be implemented in combination with, or separately from, the procedure shown by the flow chart 200 of FIG. 6. As shown in FIG. 7, after starting at a step 232, a technician or other operator will press the light/dark (L/D) button 13 at a step 234 and then release that button at a step 236. The pressing and releasing of the button 13 causes the "set" LED to be turned on and the "power" LED to be turned off, at a step 240. Then, a toggling of an output state of the circuitry 11 occurs at a step 238. After the toggling of state at the step 238, at a step 242, the setting is stored in memory. Finally, at a step 244, the "set" LED is turned off and the "power" LED is turned back on, at which point the procedure is ended at a step 246.

The procedure of FIG. 7 can be used to toggle a variety of output states (or other states) of the circuitry 11. For example, in one embodiment, a state of the photodetector 10 can be changed from a light setting to a dark setting, or vice versa. When in the light setting, the photodetector provides an output that is indicative of the degree of brightness/intensity of the light or magnitude of the light received by the photodetector, while when in the opposite state the photodetector provides an indication of the darkness or relative absence of light received at the photodetector.

Although the present discussion relates to certain embodiments of the present invention shown in FIGS. 1–7, the present invention is not limited to such embodiments. While the amplification, recovery and DC offset removal circuitry shown in and described with reference to FIGS. 3 and 5, as well as the various procedures shown in and described with reference to FIGS. 6 and 7, are described as being particularly useful in photodetectors such as the photodetector 10, such circuitry/procedures are also applicable to other devices and in other circumstances and applications as well, where the functions provided by such circuitry and such procedures are of use. Indeed, the present invention is not intended to be limited to use in photodetectors, but rather is intended to be applicable to a wide variety of sensors including both photodetectors/photosensors as well as, for example, infrared sensors, laser sensors, microwave sensors, proximity sensors, ultrasonic sensors, inductive sensors, magnetic sensors, among others. It is in particular envisioned that the particular circuitry and procedures described above are applicable to a wide variety of sensors that receive signal inputs, particularly analog signal inputs, that are to be amplified and/or processed in one or more various manners, and/or that require setting/calibration of their gain characteristics and/or some other operational characteristics.

It is additionally envisioned that one or more aspects of the present invention are applicable to such various sensors in a variety of sensor applications in addition to the industrial conveyor system application discussed above. For example, sensors in accordance with one or more aspects of the present invention could be employed in other industrial applications (e.g., in conjunction with light curtains) as well as in relation to a variety of other residential, security, office, agricultural, construction, and other environments and applications. Additionally, the present inventive embodiments can readily be combined with various other electrical or other technologies in a variety of applications such as the conveyor application discussed above as well as many other applications not necessarily relating to conveyor systems or industrial/manufacturing systems. As mentioned above, signals to and from the circuitry discussed herein, whether or not used in relation to photodetector devices, can be wirelessly transmitted/received by way of a variety of devices known in the art including Bluetooth devices and RFID devices. Further, it is envisioned that aspects of the present invention could be employed in applications not limited to those involving sensors. For example, the above-discussed circuitry involving recovery of time-varying information and/or DC offset removal could be implemented in circuits used in motor controllers or motor drives.

Also, it is envisioned that numerous particular aspects of the embodiments of the invention discussed above could be varied depending upon the circumstance. In particular, the exact circuitry and steps of the flow charts shown herein are merely exemplary and can be modified in myriad ways. For example, while the recovery circuitry 150 of FIG. 5 is described as including the DC offset removal circuitry 160, the recovery circuitry need not be understood to include such circuitry. Indeed, the DC offset removal circuitry 160 of FIG. 5 and the recovery circuitry 50 of FIG. 3 can each be implemented alone as well as in combination with one another as shown in FIG. 5. Also for example, while in FIG. 6 it is shown that the incrementing of the gain occurs prior to the decrementing of the gain, it is also possible that those steps could be reversed in their relative ordering in alternate embodiments. Further, while FIG. 6 shows indications as being provided by the pressing and releasing of a push button, the present invention is intended to encompass embodiments in which operator indications (or indications from other machine control devices such as computerized controllers) are provided in other manners. Also, while FIG. 6 relates to calibration of gain, the procedure of FIG. 6 could also be employed in relation to the calibration or other setting of other characteristics of sensors or other devices, particularly where such characteristics can be varied along a range.

Further for example, as discussed above, the MOSFETs used in the circuitry shown herein could be replaced with other transistor or switching devices (e.g., BJTs) that provided the same or similar advantages. Also for example, the first amplifier 42 shown, which is a current-input device, could be replaced with a voltage-input amplifier such as the second and third amplifiers 56,162. In the event that the amplifier 42 was a voltage-input device, the resistor 168 in some embodiments would not be necessary and/or, in certain embodiments the feedback provided to the amplifier from the DC offset removal circuitry could be provided via a different input to the amplifier rather than to one or both of the inputs 44, 46. Further for example, while the output signal provided at the output terminal 82 is shown to be a voltage output signal, in other embodiments the output signal would be simply the current flowing out of the drain 78 of the MOSFET 74 (or comparable component). Additionally, while it is envisioned that the circuitry 11 would be implemented in the form of one or more integrated circuits (e.g., an application specific integrated circuits), the circuitry could also be implemented in other manners such as by way of discrete components or by way of software implemented on a computer or microprocessor. Additionally for example, some of the steps of the flow charts could be eliminated or reordered, and other steps could be added to the flow charts depending upon the embodiment.

It is specifically intended that the present invention not be limited to the embodiments and illustrations contained herein, but include modified forms of those embodiments including portions of the embodiments and combinations of elements of different embodiments as come within the scope of the following claims.

I claim:

1. A sensor circuit comprising:
a first amplifier that receives an input signal at least indirectly from a sensing device and provides an amplified signal based upon the input signal, wherein the amplified signal at least includes a time-varying signal component; and
a recovery circuit that receives the amplified signal and provides an output signal indicative of at least a portion of the time-varying signal component of the amplified signal,
wherein the recovery circuit includes a current splitting component that operates to generate negative and positive signals indicative respectively of negative and positive portions of the time-varying signal component, and
wherein the negative and positive signals are generated in a manner such that there are no substantial discontinuities between those signals at crossover points between those signals.

2. The sensor circuit of claim 1, wherein the current splitting component includes a pair of transistor devices and a second amplifier, wherein an input port of the second amplifier is coupled at least indirectly to an output terminal of the first amplifier to receive the amplified signal.

3. The sensor circuit of claim 2, wherein the pair of transistor devices includes at least one of:
a N-channel MOSFET and a P-channel MOSFET, where the second amplifier has an output terminal coupled to gates of each of the MOSFETs; and
a NPN BJT and a PNP BJT, where the output terminal of the second amplifier is coupled to bases of each of the BJTs.

4. The sensor circuit of claim 3, wherein:
when the pair of transistor devices includes the N-channel MOSFET and the P-channel MOSFET, sources of the N-channel MOSFET and the P-channel MOSFET are coupled to one another, drains of the N-channel MOSFET and the P-channel MOSFET respectively provide the negative and positive signals, the negative and positive signals are current signals, and an additional input port of the second amplifier is biased by a voltage supply device; and
when the pair of transistor devices includes the NPN BJT and the PNP BJT, emitters of the NPN and PNP BJTs are coupled to one another, collectors of the NPN BJT and the PNP BJT respectively provide the negative and positive signals, and the negative and positive signals are current signals.

5. The sensor circuit of claim 1, further comprising a mirror circuit coupled to the current splitting component, wherein the mirror circuit provides the output signal based upon at least one of the positive and negative signals.

6. The sensor circuit of claim 5, wherein at least one of the following is true:
(a) the mirror circuit receives the positive signal, wherein the positive signal is a positive current signal, wherein the mirror circuit generates an additional current signal based upon the positive current signal, wherein the output signal is a voltage signal, and wherein the mirror generates the voltage signal by delivering the additional current signal through a resistor; and
(b) the mirror circuit includes a first mirror section coupled to at least one of a drain of a N-channel MOSFET and a collector of a NPN BJT, and a second mirror section coupled to at least one of a drain of a P-channel MOSFET and a collector of a PNP BIT, and wherein the output signal is based upon both of the negative and positive signals.

7. The sensor circuit of claim 1, wherein the sensor circuit is implemented as part of at least one of a photodetector, an infrared sensor, a laser sensor, a microwave sensor, a proximity sensor, an ultrasonic sensor, an inductive sensor, a magnetic sensor.

8. The sensor circuit of claim 1 wherein the time-varying signal component is at least one of a square wave signal, a sine wave signal, a pulsed signal having a duty cycle of less than 50%, a pulsed signal having a duty cycle of more than 50%, and a triangle wave signal.

9. The sensor circuit of claim 1, wherein the positive and negative portions of the time-varying signal respectively are portions above and below a neutral level, wherein the neutral level is situated such that positive and negative areas formed by the positive and negative portions of the time-varying signal over time with respect to the neutral level are substantially equal.

10. A sensor employing the sensor circuit of claim 1, wherein the sensor is a photodetector, wherein the sensing device is a photosensitive device coupled to the sensor circuit, wherein the photosensitive device provides the input signal thereto based upon sensed light levels detected by the photosensitive device.

11. An industrial system employing the sensor of claim 10, wherein at least a portion of the sensor circuit is implemented on an application specific integrated circuit (ASIC).

12. The sensor circuit of claim 1, further comprising a DC offset removal circuit.

13. The sensor circuit of claim 12, wherein the DC offset removal circuit is coupled between a mirror circuit of the recovery circuit and an input terminal of the first amplifier so that the DC offset removal circuit removes both a first DC offset existing within the input signal and a second DC offset created due to operation of the recovery circuit.

14. The sensor circuit of claim 12, wherein the DC offset removal circuit includes a second amplifier having an output terminal coupled to a resistor that in turn is coupled to an input terminal of the first amplifier, and having an input terminal coupled to at least one of a mirror circuit of the recovery circuit and an output terminal of the first amplifier, wherein a capacitor is coupled between the input terminal and the output terminal of the second amplifier.

15. An amplification circuit comprising:
a first amplifier that receives an input signal at least indirectly from another device and provides an amplified signal based upon the input signal, wherein each the amplified signal at least includes a time-varying signal component, means for recovering at least a portion of the time-varying signal component, and means for removing a DC offset that is provided with the input signal and introduced by the means for recovering.

16. The amplification circuit of claim 15, include a recovery circuit that receives the amplified signal and provides an output signal indicative of at least a portion of the time-varying signal component of the amplified signal, wherein the recovery circuit includes a current splitting component with a pair of transistor devices and a second amplifier, and wherein an input port of the second amplifier is coupled at least indirectly to an output terminal of the first amplifier to receive the amplified signal.

17. The amplification circuit of claim 15, wherein the means for removing includes a DC offset removal circuit that includes a second amplifier having an output terminal coupled at least indirectly to an input terminal of the first amplifier, and having an input terminal coupled to at least one of a mirror circuit of a recovery circuit and an output terminal of the first amplifier, wherein a capacitor is coupled between the input terminal and the output terminal of the second amplifier.

18. A photodetector comprising the amplification circuit of claim 15.

19. A motorized system comprising the amplification circuit of claim 15.

20. A method of amplifying a time-varying signal, the method comprising:
receiving the time-varying signal at an input port of a first amplifier;
outputting an amplified time-varying signal an output port of the first amplifier; and
extracting at least a portion of time-varying information within the amplified time-varying signal by way of a current-splitting circuit having a second amplifier and two complementary transistor devices, wherein an input terminal of the second amplifier is provided at least indirectly with the amplified time-varying signal and a signal indicative of an extracted portion of the time-varying information is output by at least one of the transistor devices; and
removing a DC offset by way of a DC offset removal circuit having a third amplifier and a capacitor coupled between input and output terminals of the third amplifier, wherein the output terminal of the third amplifier is coupled at least indirectly to the input port of the third amplifier.

21. A sensor circuit comprising:
a first amplifier that receives an input signal at least indirectly from a sensing device and provides an amplified signal based upon the input signal, wherein the amplified signal at least includes a time-varying signal component;
a recovery circuit that receives the amplified signal and provides an output signal indicative of at least a portion of the time-varying signal component of the amplified signal; and
a feedback circuit linking the recovery circuit to the first amplifier, wherein the recovery circuit includes a current splitting component that operates to generate negative and positive signals indicative respectively of negative and positive portions of the time-varying signal component, wherein the negative and positive signals are generated in a manner such that there are no substantial discontinuities between those signals at crossover points between those signals, and wherein the feedback circuit allows for removal of a DC offset.

22. The sensor circuit of claim 21, wherein the DC offset that is removed includes both a first component that is provided as part of the input signal, and a second component that is generated by at least one of the recovery circuit and the feedback circuit.

23. The sensor circuit of claim 21, wherein an output signal provided by way of the current splitting component of the recovery circuit is based upon only one of the negative and positive signals.

24. The sensor circuit of claim 23, wherein at least one of the following is true:
the output signal is provided by way of only a single mirror circuit of the current splitting component; and
the input signal is a pulsed signal having a duty cycle of less than 50%.

25. A photosensitive circuit assembly comprising the sensor circuit of claim 21, and further comprising a photosensitive device that provides the input signal to the sensor circuit.

26. An amplification circuit comprising:
a first amplifier that receives an input signal at least indirectly from another device and provides an amplified signal based upon the input signal, wherein the amplified signal at least includes a time-varying signal component, and
(a) means for recovering at least a portion of the time-varying signal component, wherein the means for recovering includes a recovery circuit that receives the amplified signal and provides a first output signal indicative of at least a portion of the time-varying signal component of the amplified signal, wherein the recovery circuit includes a current splitting component with a pair of transistor devices and a second amplifier, and wherein an input port of the second amplifier is coupled at least indirectly to a first output terminal of the first amplifier to receive the amplified signal; and
(b) means for removing a DC offset that is at least one of provided with the input signal and introduced by the means for recovering, wherein the means for removing includes a DC offset removal circuit that includes a third amplifier having a second output terminal coupled at least indirectly to a first input terminal of the first amplifier, and having a second input terminal coupled to at least one of a mirror circuit of the recovery circuit and the first output terminal of the first amplifier, wherein a capacitor is coupled between the second input terminal and the second output terminal of the third amplifier.

* * * * *

UNITED STATES PATENT AND TRADEMARK OFFICE
CERTIFICATE OF CORRECTION

PATENT NO.      : 7,223,957 B2  
APPLICATION NO. : 11/107443  
DATED           : May 29, 2007  
INVENTOR(S)     : George E. Rollins Page 1 of 1

It is certified that error appears in the above-identified patent and that said Letters Patent is hereby corrected as shown below:

Column 15, line 6: Replace "include" with --wherein the means for recovering includes--.

Signed and Sealed this

Thirtieth Day of October, 2007

JON W. DUDAS  
*Director of the United States Patent and Trademark Office*